US012556097B2

(12) United States Patent
Hong et al.

(10) Patent No.: US 12,556,097 B2
(45) Date of Patent: Feb. 17, 2026

(54) SWITCHING MODULE

(71) Applicant: Delta Electronics (Shanghai) Co., Ltd., Shanghai (CN)

(72) Inventors: Shouyu Hong, Shanghai (CN); Tao Wang, Shanghai (CN); Haibin Xu, Shanghai (CN); Weicheng Zhou, Shanghai (CN); Min Zhou, Shanghai (CN); Yiqing Ye, Shanghai (CN)

(73) Assignee: Delta Electronics (Shanghai) Co., Ltd., Shanghai (CN)

( * ) Notice: Subject to any disclaimer, the term of this patent is extended or adjusted under 35 U.S.C. 154(b) by 654 days.

(21) Appl. No.: 17/893,984

(22) Filed: Aug. 23, 2022

(65) Prior Publication Data

US 2023/0155509 A1 May 18, 2023

(30) Foreign Application Priority Data

Nov. 18, 2021 (CN) .......................... 202111370610.7

(51) Int. Cl.
*H02M 3/15* (2006.01)
*H02M 1/00* (2006.01)
(Continued)

(52) U.S. Cl.
CPC ....... *H02M 3/1584* (2013.01); *H02M 1/0048* (2021.05); *H02M 1/0064* (2021.05); *H02M 1/44* (2013.01); *H02M 3/003* (2021.05)

(58) Field of Classification Search
CPC ............ H02M 3/1584; H02M 1/0048; H02M 1/0064; H02M 1/44; H02M 3/003;
(Continued)

(56) References Cited

U.S. PATENT DOCUMENTS 6,016,007 A * 1/2000 Sanger ................. H01L 23/473
257/E23.098
2015/0207429 A1* 7/2015 Akiyama .............. H02M 1/088
363/131
(Continued)

FOREIGN PATENT DOCUMENTS

CN 101283264 A 10/2008
CN 107910112 A 4/2018
(Continued)

OTHER PUBLICATIONS

Nagl, Bernhard et al., Analysis of Thermomechanically Related Failures of Traction IGBT power Modules at Short Circuit Switching, IEEE, 2010.

*Primary Examiner* — S M Sohel Imtiaz
(74) *Attorney, Agent, or Firm* — KIRTON McCONKIE; Evan R. Witt

(57) ABSTRACT

A switching module includes at least one substrate, at least one switching element, at least one control loop, a first power part and a second power part. The at least one switching element is disposed on the at least one substrate. The at least one control loop is connected with the corresponding switching element. The first power part is connected with the corresponding switching element. The second power part is connected with the corresponding switching element. A direction of a first current flowing through the first power part and a direction of a second current flowing through the second power part are identical. A projection of the first power part on a reference plane and a projection of the second power part on the reference plane are located at two opposite sides of a projection of the control loop on the reference plane.

16 Claims, 15 Drawing Sheets

(51) Int. Cl.
    *H02M 1/44*     (2007.01)
    *H02M 3/00*     (2006.01)
    *H02M 3/158*    (2006.01)

(58) Field of Classification Search
    CPC ......... H01L 23/49562; H01L 23/49575; H01L 25/072; H01L 24/06; H01L 24/32; H01L 24/49
    See application file for complete search history.

(56) References Cited

U.S. PATENT DOCUMENTS

| | | | |
|---|---|---|---|
| 2016/0164417 A1* | 6/2016 | Ishii | H02M 3/155 323/271 |
| 2016/0294301 A1* | 10/2016 | Yokoyama | H05K 5/0017 |
| 2019/0069430 A1* | 2/2019 | Compton | H05K 7/1457 |
| 2019/0103806 A1* | 4/2019 | Miyake | H02M 3/1584 |
| 2020/0336080 A1* | 10/2020 | Yang | H02M 3/156 |
| 2020/0366199 A1* | 11/2020 | Ikeda | H01L 25/18 |
| 2021/0351161 A1* | 11/2021 | Iguchi | H01L 23/49811 |
| 2022/0360178 A1* | 11/2022 | Park | H02M 1/4233 |

FOREIGN PATENT DOCUMENTS

| | | | | |
|---|---|---|---|---|
| WO | WO-2018043535 A1 * | 3/2018 | | H01L 23/36 |
| WO | 2019235146 A1 | 12/2019 | | |

* cited by examiner

SWITCHING MODULE

CROSS-REFERENCE TO RELATED APPLICATION

This application claims priority to China Patent Application No. 202111370610.7, filed on Nov. 18, 2021, the entire contents of which are incorporated herein by reference for all purposes.

FIELD OF THE INVENTION

The present disclosure relates to a switching module, and more particularly to a switching module for reducing the mutual inductance between a power loop and a control loop.

BACKGROUND OF THE INVENTION

Generally, a switching module of a power electronic system operates at a high frequency to achieve high power density. However, the high operating frequency may increase the switching loss, and thus reduce the efficiency of the switching module. Consequently, when the switching module operates at the high frequency, it is necessary to increase the switching speed of the switching module in order to reduce the switching loss. However, when the switching module operates at the higher switching speed, a serious electromagnetic interference (EMI) problem occurs.

Especially, in case that the switching module has a high power density structure, the power loop is relatively close to the control loop. When the current in the power loop changes, the induced magnetic field also changes around the power loop. As the induced magnetic field passes through the control loop, a corresponding induced voltage is generated in the control loop. Consequently, the electromagnetic interference of the mutual inductance between the power loop and the control loop is formed, which affects the switching operation of the switching module.

In the conventional switching module, a plurality of power loops are located beside each other, and a plurality of control loops are located beside each other. In other words, no control loop is arranged between every two adjacent power loops, and no power loop is arranged between every two adjacent control loops. Consequently, the induced magnetic fields generated by the power loops pass through the control loops in the same direction. Under this circumstance, the electromagnetic interference of the mutual inductance between the power loops and the control loops is largely increased. If the electromagnetic interference of the mutual inductance is too large, the interference voltage at a control terminal of the switching module may exceed the safe range. Under this circumstance, the reliability of the switching module is reduced, and the switching module is even unable to work normally.

Therefore, there is a need of providing an improved switching module in order to overcome the drawbacks of the conventional technologies.

SUMMARY OF THE INVENTION

The present disclosure provides a switching module for reducing the mutual inductance between a power loop and a control loop.

In accordance with an aspect of the present disclosure, a switching module is provided. The switching module includes at least one substrate, at least one switching element, at least one control loop, a first power part and a second power part. The at least one switching element is disposed on the at least one substrate. The at least one control loop is connected with the corresponding switching element. The first power part is connected with the corresponding switching element. The second power part is connected with the corresponding switching element. A direction of a first current flowing through the first power part and a direction of a second current flowing through the second power part are identical. A projection of the first power part on a reference plane and a projection of the second power part on the reference plane are located at two opposite sides of a projection of the control loop on the reference plane.

The above contents of the present disclosure will become more readily apparent to those ordinarily skilled in the art after reviewing the following detailed description and accompanying drawings, in which:

DETAILED DESCRIPTION OF THE PREFERRED EMBODIMENT

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed.

Figure 1:
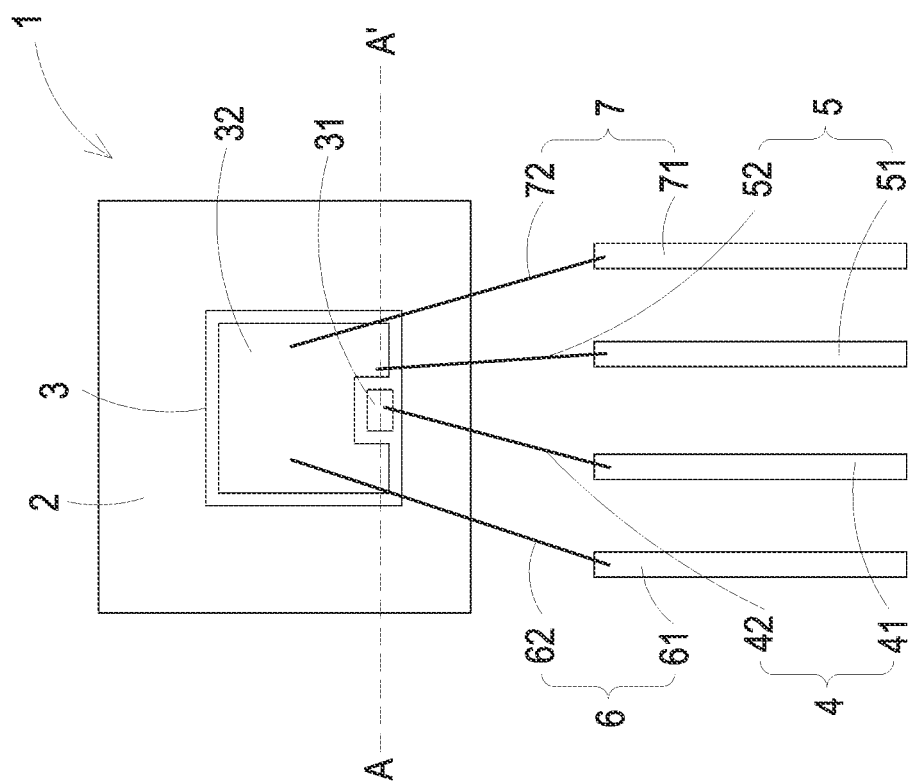
FIG. 1 is a schematic view illustrating the structure of a switching module according to a first embodiment of the present disclosure.
Figure 2:
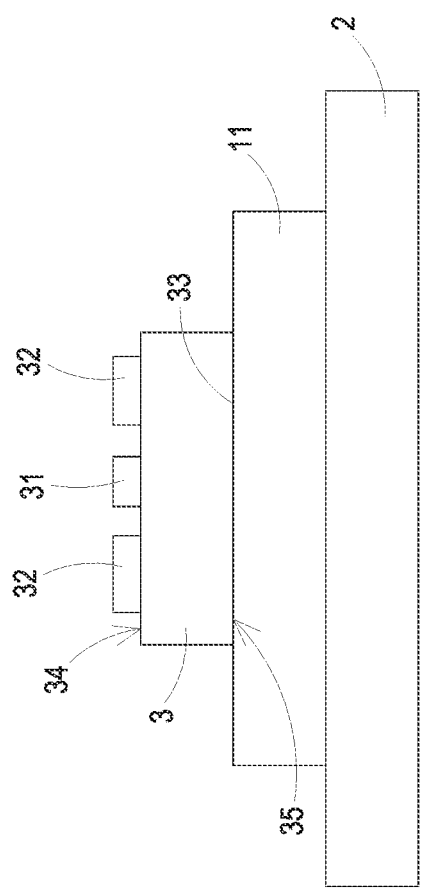
FIG. 2 is a schematic side view illustrating a portion of the switching module as shown in FIG. 1 and taken along the section A-A'.
Figure 3:
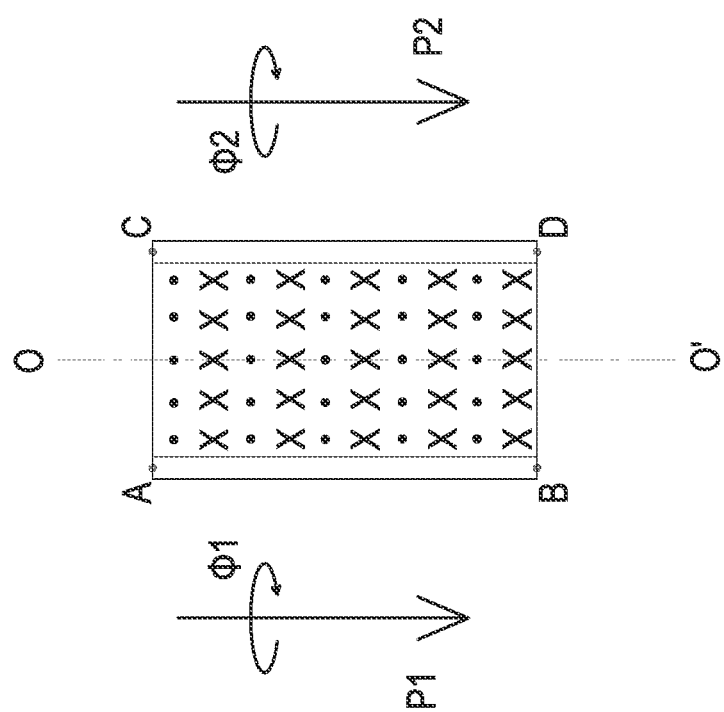
FIG. 3 schematically illustrates the magnetic flux cancellation principle for the switching module as shown in FIG. 1.

Please refer to FIGS. 1, 2 and 3. FIG. 1 is a schematic view illustrating the structure of a switching module according to a first embodiment of the present disclosure. FIG. 2 is a schematic side view illustrating a portion of the switching module as shown in FIG. 1 and taken along the section A-A'. FIG. 3 schematically illustrates the magnetic flux cancellation principle for the switching module as shown in FIG. 1.

In an embodiment, the switching module 1 is disposed on a main circuit board (not shown) and electrically connected with the main circuit board. The switching module 1 includes a substrate 2, a switching element 3, a first control part 4, a second control part 5, a first power part 6 and a second power part 7.

In an embodiment, the switching element 3 is a vertical-type device. Preferably but not exclusively, the switching element 3 is an insulated gate bipolar transistor (IGBT), a bipolar junction transistor (BJT), a metal-oxide-semiconductor field-effect transistor (MOSFET), a junction field effect transistor (JFET) or a gallium nitride high electron mobility transistor (GaN-HEMT).

As shown in FIG. 2, the switching element 3 is welded on the substrate 2 through a connecting material 11. The switching element 3 includes a first control terminal 31, a second control terminal, a first power terminal and a second power terminal 33. The first control terminal 31, the second control terminal and the first power terminal are disposed on a first surface 34 of the switching element 3. Since the second control terminal and the first power terminal are located at the same region of the switching element 3, the second control terminal and the first power terminal are also referred as a common conductive terminal 32. The second power terminal 33 is disposed on a second surface 35 of the switching element 3. The second power terminal 33 is connected with the substrate 2 through the connecting material 11.

In some embodiments, in case that the switching element 3 is an insulated gate bipolar transistor (IGBT), the first control terminal 31 is served as a gate terminal of the switching element 3, the common conductive terminal 32 (i.e., the second control terminal and the first power terminal) is served as an emitter of the switching element 3, and the second power terminal 33 is served as a collector of the switching element 3. In some other embodiments, in case that the switching element 3 is a bipolar junction transistor (BJT), the first control terminal 31 is served as a base of the switching element 3, the common conductive terminal 32 (i.e., the second control terminal and the first power terminal) is served as an emitter of the switching element 3, and the second power terminal 33 is served as a collector of the switching element 3. In some other embodiments, in case that the switching element 3 is a metal-oxide-semiconductor field-effect transistor (MOSFET), a junction field effect transistor (JFET) or a gallium nitride high electron mobility transistor (GaN-HEMT), the first control terminal 31 is served as a gate terminal of the switching element 3, the common conductive terminal 32 (i.e., the second control terminal and the first power terminal) is served as a source terminal of the switching element 3, and the second power terminal 33 is served as a drain terminal of the switching element 3.

Please refer to FIG. 1 again. The first control part 4 is connected with the first control terminal 31 of the switching element 3. The first control part 4 includes a first control pin 41 and a first control conductor 42. The first control pin 41 is disposed on the main circuit board. The first control conductor 42 is connected between the first control pin 41 and the first control terminal 31 of the switching element 3. The second control part 5 is connected with the second control terminal (i.e., the common conductive terminal 32) of the switching element 3. The second control part 5 includes a second control pin 51 and a second control conductor 52. The second control pin 51 is disposed on the main circuit board. The second control conductor 52 is connected between the second control pin 51 and the second control terminal (i.e., the common conductive terminal 32) of the switching element 3. Moreover, a control loop of the switching module 1 is defined by the second control terminal (i.e., the common conductive terminal 32), the second control conductor 52, the second control pin 51, the main circuit board, the first control pin 41, the first control conductor 42 and the first control terminal 31 collaboratively.

The first power part 6 is connected with the first power terminal (i.e., the common conductive terminal 32) of the switching element 3. The first power part 6 includes a first power pin 61 and a first power conductor 62. The first power pin 61 is disposed on the main circuit board. The first power conductor 62 is connected between the first power pin 61 and the first power terminal (i.e., the common conductive terminal 32) of the switching element 3. A first current flows through the first power part 6. The second power part 7 is connected with the first power terminal (i.e., the common conductive terminal 32) of the switching element 3. The second power part 7 includes a second power pin 71 and a second power conductor 72. The second power pin 71 is disposed on the main circuit board. The second power conductor 72 is connected between the second power pin 71 and the first power terminal (i.e., the common conductive terminal 32) of the switching element 3. A second current flows through the second power part 7.

It is noted that the switching element 3 corresponding to the first power part 6 and the switching element 3 corresponding to the second power part 7 may be the identical or different switching elements 3. In other words, the first power part 6 and the second power part 7 may be connected with the same switching element 3 or respectively connected with two different switching elements 3. In this embodiment, the direction of the first current flowing through the first power part 6 and the direction of the second current flowing through the second power part 7 are identical. That is, the first current flows from the first power terminal (i.e., the common conductive terminal 32) to the first power pin 61 of the first power part 6 and the second current flows from the first power terminal (i.e., the common conductive terminal 32) to the second power pin 71 of the second power part 7, or the first current flows from the first power pin 61 of the first power part 6 to the first power terminal (i.e., the common conductive terminal 32) and the second current flows from the second power pin 71 of the second power part 7 to the first power terminal (i.e., the common conductive terminal 32). It is noted that numerous modifications and alterations may be made while retaining the teachings of the disclosure. For example, in another embodiment, the first power part 6 and the second power part 7 are connected with the second power terminal 33 of the corresponding switching element 3. However, the direction of the first current flowing through the first power part 6 and the direction of the second current flowing through the second power part 7 are identical.

In this embodiment, the first power part 6, the first control part 4, the second control part 5 and the second power part 7 are arranged sequentially. The projection of the first power part 6 on a reference plane and a projection of the second power part 7 on the same reference plane are located at two sides of a projection of the control loop of the switching module 1 (i.e., the control loop defined by the first control part 4 and the second control part 5) on the reference plane. Preferably, the reference plane is coplanar with the substrate 2. In an embodiment, the length of the first power part 6 is equal to the length of the second power part 7. Consequently, the current value of the first current flowing through the first power part 6 and the current value of the second current flowing through the second power part 7 are equal. Under this circumstance, the current value here refers to the amplitude of the corresponding current or the effective value of the corresponding current.

In FIG. 3, the projections of the first power part 6, the second power part 7 and the control loop on the reference plane are shown. The point A and the point B as shown in FIG. 3 denote two ends of the projection of the first control part 4 on the reference plane, respectively. The point C and the point D as shown in FIG. 3 denote two ends of the projection of the second control part 5 on the reference plane, respectively. Moreover, the line P1 denotes the first current flowing through the first power part 6, and the line P2 denotes the second current flowing through the second power part 7. In the embodiment, the point B and the point D are connected with each other through the main circuit board. Consequently, the rectangular region defined by the points A, B, C and D represents the projection of the control loop on the reference plane. The line O-O' represents the center line of the control loop on the reference plane. That is, the center line O-O' passes through the midpoint of a line segment connecting the point A and the point C, and the midpoint of a line segment connecting the point B and the point D. The projection of the first power part 6 on the reference plane and the projection of the second power part 7 on the reference plane are located at two sides of the projection of the control loop on the reference plane, respectively. For example, the first current P1 flowing through the first power part 6 and the second current P2 flowing through the second power part 7 are symmetrical the two sides of the projection of the control loop on the reference plane. Preferably but not exclusively, the distance between the projection of the first power part 6 on the reference plane and the center line O-O' is equal to the distance between the projection of the second power part 7 on the reference plane and the center line O-O'. For example, it can be set that the smallest distance between the projection of the first power part 6 on the reference plane and the center line O-O' is 1 mm, and the smallest distance between the projection of the second power part 7 on the reference plane and the center line O-O' is 1 mm. The first current P1 flowing through the first power part 6 produces a total magnetic flux $\Phi 1$ through the control loop. The second current P2 flowing through the second power part 7 produces a total magnetic flux $\Phi 2$ through the control loop. Since the direction of the first current P1 and the direction of the second current P2 are identical, the magnitude of the magnetic flux $\Phi 1$ and the magnitude of the magnetic flux $\Phi 2$ are equal, but the direction of the magnetic flux $\Phi 1$ and the direction of the magnetic flux $\Phi 2$ are opposite. In other words, the direction of the magnetic flux induced by the first current P1 through the control loop is perpendicular to the paper surface and inward, and the direction of the magnetic flux induced by the second current P2 through the control loop is perpendicular to the paper surface and outward. The magnetic flux $\Phi 1$ and the magnetic flux $\Phi 2$ are cancelled out. Consequently, the overall mutual inductance between the first power part 6, the second power part 7 and the control loop is largely reduced.

As mentioned above, the direction of the first current P1 flowing through the first power part 6 and the direction of the second current P2 flowing through the second power part 7 are identical. In addition, the projection of the first power part 6 on the reference plane and the projection of the second power part 7 on the same reference plane are located at two sides of the projection of the control loop of the switching module 1 on the reference plane. In comparison with the conventional switching module, the mutual inductance between the power loop and the control loop in the switching module 1 of the present disclosure is reduced. Consequently, the safety performance of the switching module 1 is enhanced.

As mentioned above, the direction of the first current P1 and the direction of the second current P2 are identical. That is, the direction of the first current P1 and the direction of the second current P2 are in parallel with each other. It is noted that the direction of the first current P1 and the direction of the second current P2 are not restricted to be in parallel with each other. For example, in some embodiments, there is an angle between the direction of the first current P1 and the direction of the second current P2. The angle is smaller than 90 degrees. Particularly, after the first power part 6 and the second power part 7 are projected to a reference plane, the angle between first current P1 and the second current P2 is 0 degree or an acute angle. The reference plane is a plane coplanar with the substrate 2 or a plane that is perpendicular to the substrate 2 and passes through the center line O-O'.

In some embodiments, the direction of the first current P1 and the direction of the second current P2 are identical, but the first power part 6 and the second power part 7 are not completely symmetric with respect to the control loop or the magnitude of the first current P1 and the magnitude of the second current P2 are different. Since the direction of the magnetic flux $\Phi 1$ corresponding to the first current P1 and the direction of the magnetic flux $\Phi 2$ corresponding to the second current P2 are opposite, the magnetic flux $\Phi 1$ and the magnetic flux $\Phi 2$ are cancelled out. Consequently, the overall mutual inductance between the first power part 6, the second power part 7 and the control loop is largely reduced.

In some embodiments, the direction of the first current P1 flowing through the first power part 6 and the direction of the second current P2 flowing through the second power part 7 are in parallel with each other or tilted respective to each other. As long as the magnetic flux $\Phi 1$ corresponding to the first current P1 and the magnetic flux $\Phi 2$ corresponding to the second current P2 can be cancelled out and the mutual inductance is reduced, the installation positions of the first power part 6 and the second power part 7 are not restricted.

Figure 4:
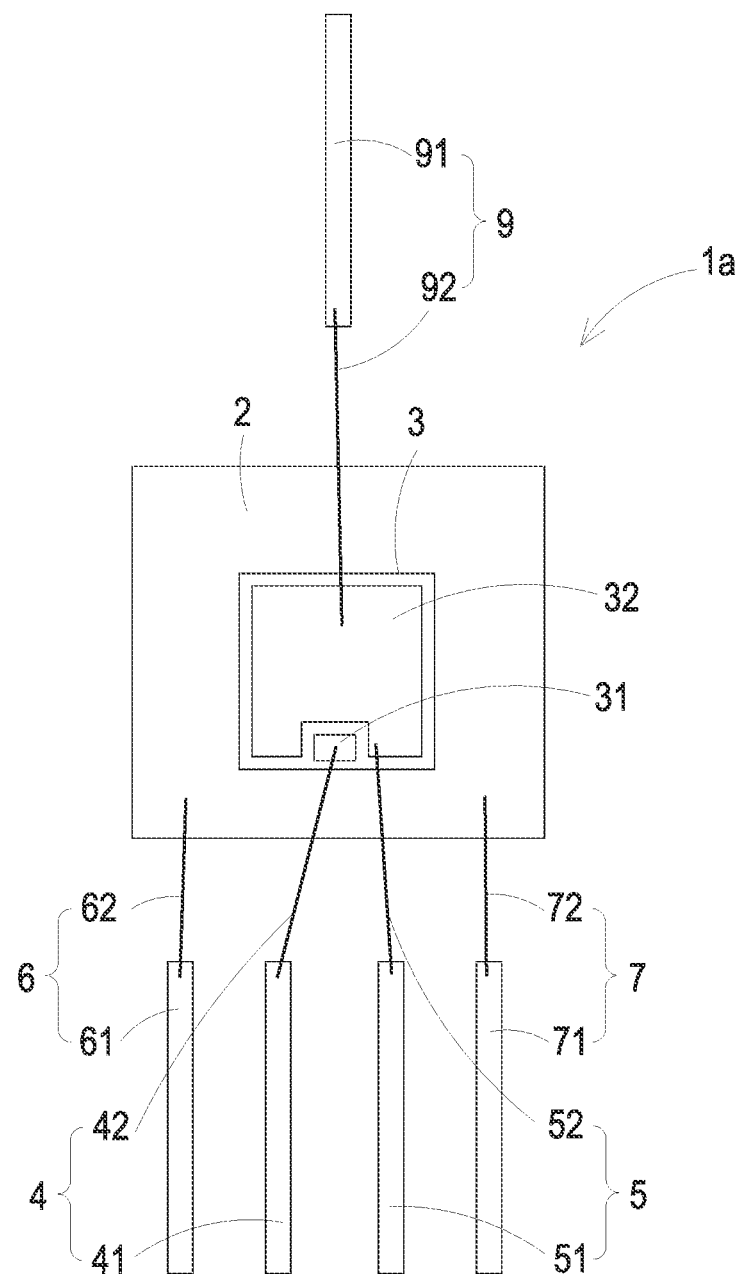
FIG. 4 is a schematic view illustrating the structure of a switching module according to a second embodiment of the present disclosure.

Please refer to FIG. 4. FIG. 4 is a schematic view illustrating the structure of a switching module according to a second embodiment of the present disclosure. The structures and functions of the components of the switching module 1a which are identical to those of the first embodiment as shown in FIG. 1 are not redundantly described herein. In comparison with the switching module 1, the switching module 1a of this embodiment further includes a fourth power part 9. The first power part 6 and the second power part 7 of the switching module 1a are connected with the second power terminal 33 of the corresponding switching element 3 through the substrate 2. The fourth power part 9 is connected with the common conductive terminal 32 of the corresponding switching element 3. The fourth power part 9 includes a fourth power pin 91 and the fourth power conductor 92. The fourth power pin 91 is disposed on the main circuit board. The fourth power conductor 92 is connected between the fourth power pin 91 and the common conductive terminal 32 of the corresponding switching element 3.

In this embodiment, the projection of the substrate 2 on the reference plane is a square with four sides. The projections of the first power part 6 and the second power part 7 are located at the same side with respect to the projection of the substrate 2. The projection of the fourth power part 9 and the projection of the first power part 6 (or the second power part 7) are located at different sides of the projection of the substrate 2. For example, the projections of the first power part 6 and the second power part 7 are located at a first side of the projection of the substrate 2, and the projection of the fourth power part 9 is located at a second side of the projection of the substrate 2. In an embodiment, the first side and the second side of the projection of the substrate 2 are opposite to each other. In another embodiment, the first side and the second side of the projection of the substrate 2 are adjacent to each other.

Figure 5A:
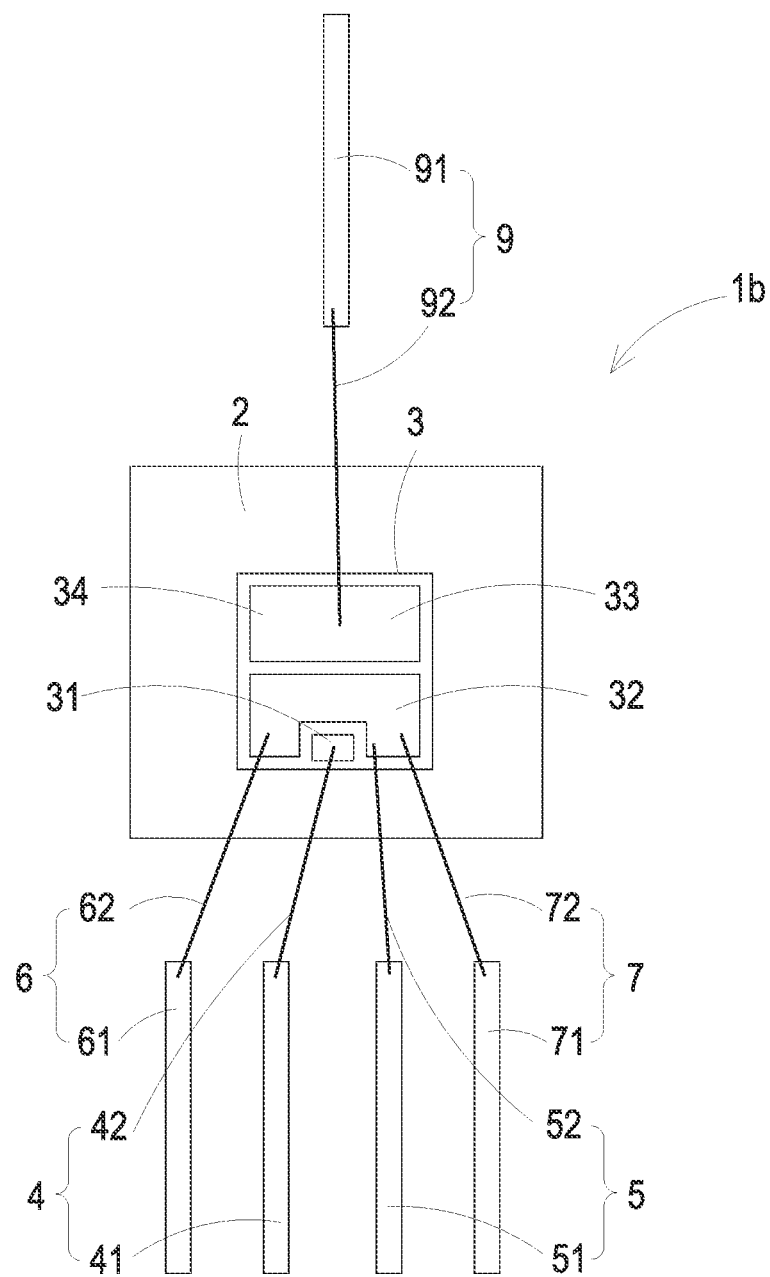
FIG. 5A is a schematic view illustrating the structure of a switching module according to a third embodiment of the present disclosure.
Figure 5B:
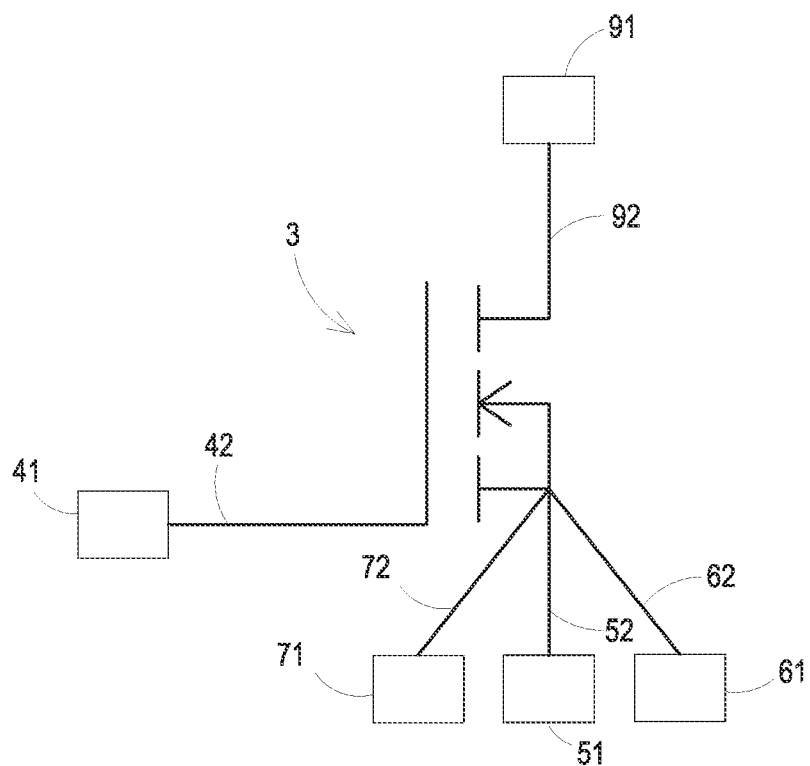
FIG. 5B is a schematic circuit diagram of the switching module as shown in FIG. 5A.

Please refer to FIGS. 5A and 5B. FIG. 5A is a schematic view illustrating the structure of a switching module according to a third embodiment of the present disclosure. FIG. 5B is a schematic circuit diagram of the switching module as shown in FIG. 5A. The structures and functions of the components of the switching module 1b which are identical to those of the first embodiment as shown in FIG. 1 are not redundantly described herein. The switching element 3 of the switching module 1 as shown in FIG. 1 has a vertical-type structure. In this embodiment, the switching element 3 of the switching module 1b is a planar switching element. That is, the second power terminal 33, the first control terminal 31 and the common conductive terminal 32 are disposed on the first surface 34 of the switching element 3. The first power part 6 and the second power part 7 are connected with the common conductive terminal 32. The fourth power part 9 is connected with the second power terminal 33.

Figure 6:
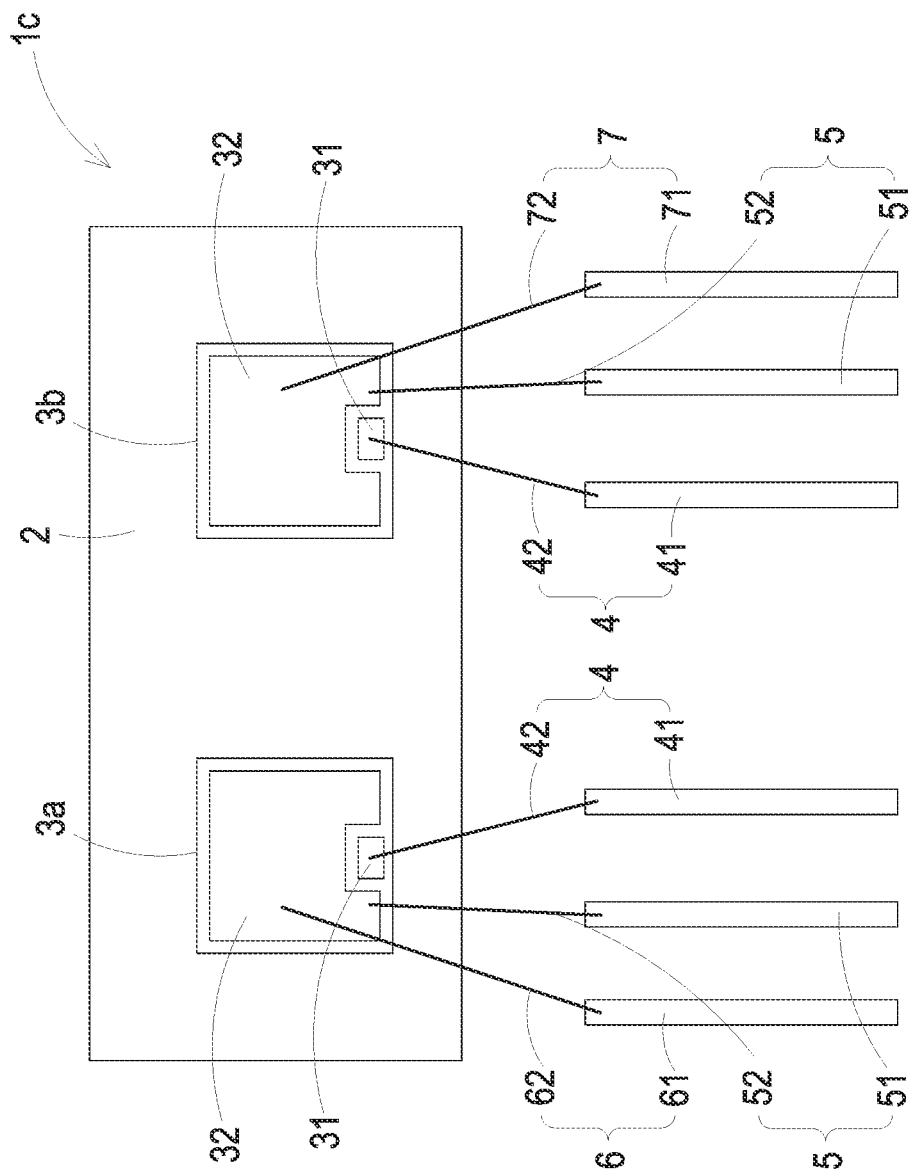
FIG. 6 is a schematic view illustrating the structure of a switching module according to a fourth embodiment of the present disclosure.

FIG. 6 is a schematic view illustrating the structure of a switching module according to a fourth embodiment of the present disclosure. The structures and functions of the components of the switching module 1c which are identical to those of the first embodiment as shown in FIG. 1 are not redundantly described herein. In this embodiment, the switching module 1c includes two switching elements (i.e., a first switching element 3a and a second switching element 3b), two first control parts 4, two second control parts 5, a first power parts 6 and a second power part 7. The first switching element 3a and the second switching element 3b are connected with each other in parallel. One of the two first control parts 4 is connected with the first control terminal 31 of the first switching element 3a. The other of the two first control parts 4 is connected with the first control terminal 31 of the second switching element 3b. One of the two second control parts 5 is connected with the common conductive terminal 32 of the first switching element 3a. The other of the second control parts 5 is connected with the common conductive terminal 32 of the second switching element 3b.

The first power part 6 is connected with the common conductive terminal 32 of the first switching element 3a. The second power part 7 is connected with the common conductive terminal 32 of the second switching element 3b. In this embodiment, the first power part 6, the second control part 5 connected with the first switching element 3a, the first control part 4 connected with the first switching element 3a, the first control part 4 connected with the second switching element 3b, the second control part 5 connected with the second switching element 3b and the second power part 7 are arranged sequentially.

In this embodiment, a first control loop of the switching module 1c is defined by the common conductive terminal 32 of the first switching element 3a, the corresponding second control conductor 52, the second control pin 51, the main circuit board, the first control pin 41, the corresponding first control conductor 42 and the first control terminal 31 of the first switching element 3a collaboratively. In addition, a second control loop of the switching module 1c is defined by the common conductive terminal 32 of the second switching element 3b, the corresponding second control conductor 52, the corresponding second control pin 51, the main circuit board, the first control pin 41, the first control conductor 42 and the first control terminal 31 of the second switching element 3b collaboratively. In this embodiment, the direction of the first current flowing through the first power part 6 and the direction of the second current flowing through the second power part 7 are identical. That is, the first current flows from the common conductive terminal 32 to the first power pin 61 of the first power part 6 and the second current flows from the common conductive terminal 32 to the second power pin 71 of the second power part 7, or the first current flows from the first power pin 61 of the first power part 6 to the common conductive terminal 32 and the second current flows from the second power pin 71 of the second power part 7 to the common conductive terminal 32. The magnetic flux through the first control loop and the second control loop induced by the first current flowing through the first power part 6 and the magnetic flux through the first control loop and the second control loop induced by the second current flowing through the second power part 7 are cancelled out. Consequently, the overall mutual inductance between the first power part 6, the second power part 7 and the first control loop and/or the second control loop is largely reduced. In this way, the reliability of the switching elements 1c is increased.

Figure 7:
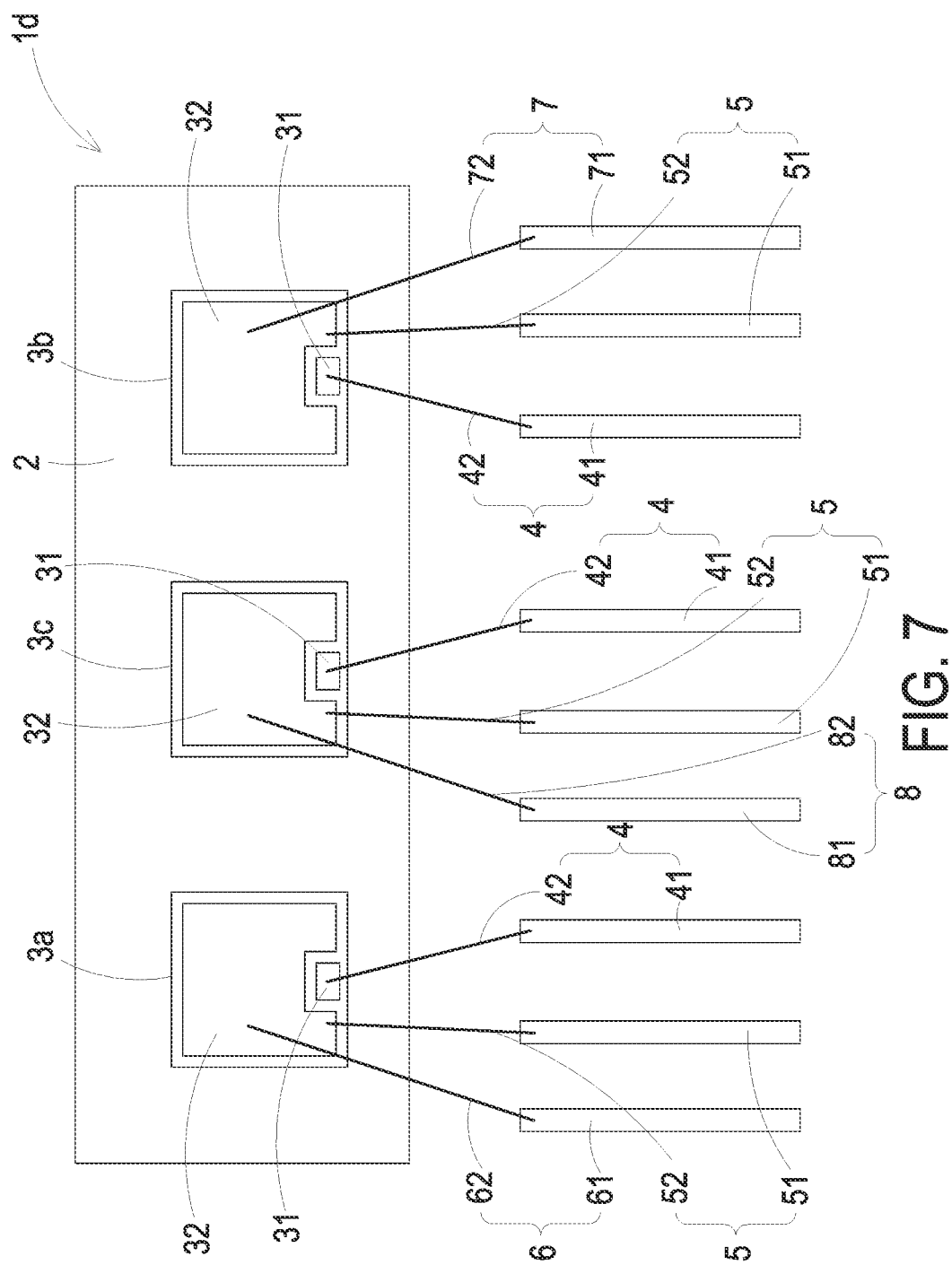
FIG. 7 is a schematic view illustrating the structure of a switching module according to a fifth embodiment of the present disclosure.

FIG. 7 is a schematic view illustrating the structure of a switching module according to a fifth embodiment of the present disclosure. The structures and functions of the components of the switching module 1d which are identical to those of the fourth embodiment as shown in FIG. 6 are not redundantly described herein. In comparison with the switching module 1c of FIG. 6, the switching module 1d includes three switching elements (i.e., a first switching element 3a, a second switching element 3b and a third switching element 3c), three first control parts 4, three second control parts 5, a first power parts 6 and a second power part 7. The third switching element 3c is arranged between the first switching element 3a and the second switching element 3b. The first switching element 3a, the second switching element 3b and the third switching element 3c are connected with each other in parallel. The additional first control part 4 is connected with the first control terminal 31 of the third switching element 3c. The additional second control part 5 is connected with the common conductive terminal 32 of the third switching element 3c.

In this embodiment, the switching module 1d further includes a third power part 8. The third power part 8 is connected with the common conductive terminal 32 of the third switching element 3c. The third power part 8 includes a third power pin 81 and the third power conductor 82. The third power pin 81 is disposed on the main circuit board. The third power conductor 82 is connected between the third power pin 81 and the common conductive terminal 32 of the third switching element 3c. A third current flows through the third power part 8. The direction of the third current, the direction of the first current flowing through the first power part 6 and the direction of the second current flowing through the second power part 7 are identical. In this embodiment, the first power part 6, the second control part 5 connected with the first switching element 3a, the first control part 4 connected with the first switching element 3a, the third power part 8, the second control part 5 connected with the third switching element 3c, the first control part 4 connected with the third switching element 3c, the first control part 4 connected with the second switching element 3b, the second control part 5 connected with the second switching element 3b and the second power part 7 are arranged sequentially. It is noted that the position of the third power part 8 is not restricted. For example, in another embodiment, the first power part 6, the second control part 5 connected with the first switching element 3a, the first control part 4 connected with the first switching element 3a, the second control part 5 connected with the third switching element 3c, the first control part 4 connected with the third switching element 3c, the third power part 8, the first control part 4 connected with the second switching element 3b, the second control part 5 connected with the second switching element 3b and the second power part 7 are arranged sequentially.

In this embodiment, the direction of the first current flowing through the first power part 6, the direction of the second current flowing through the second power part 7 and the direction of the third current flowing through the third power part 8 are identical. Consequently, the mutual inductance between the first power part 6, the second power part 7 and the control loops is largely reduced, and the mutual inductance between the second power part 7, the third power part 8 and the control loops is largely reduced. Since the interference of the high-frequency control signal is avoided, the reliability of the switching elements 1d is increased.

Figure 8:
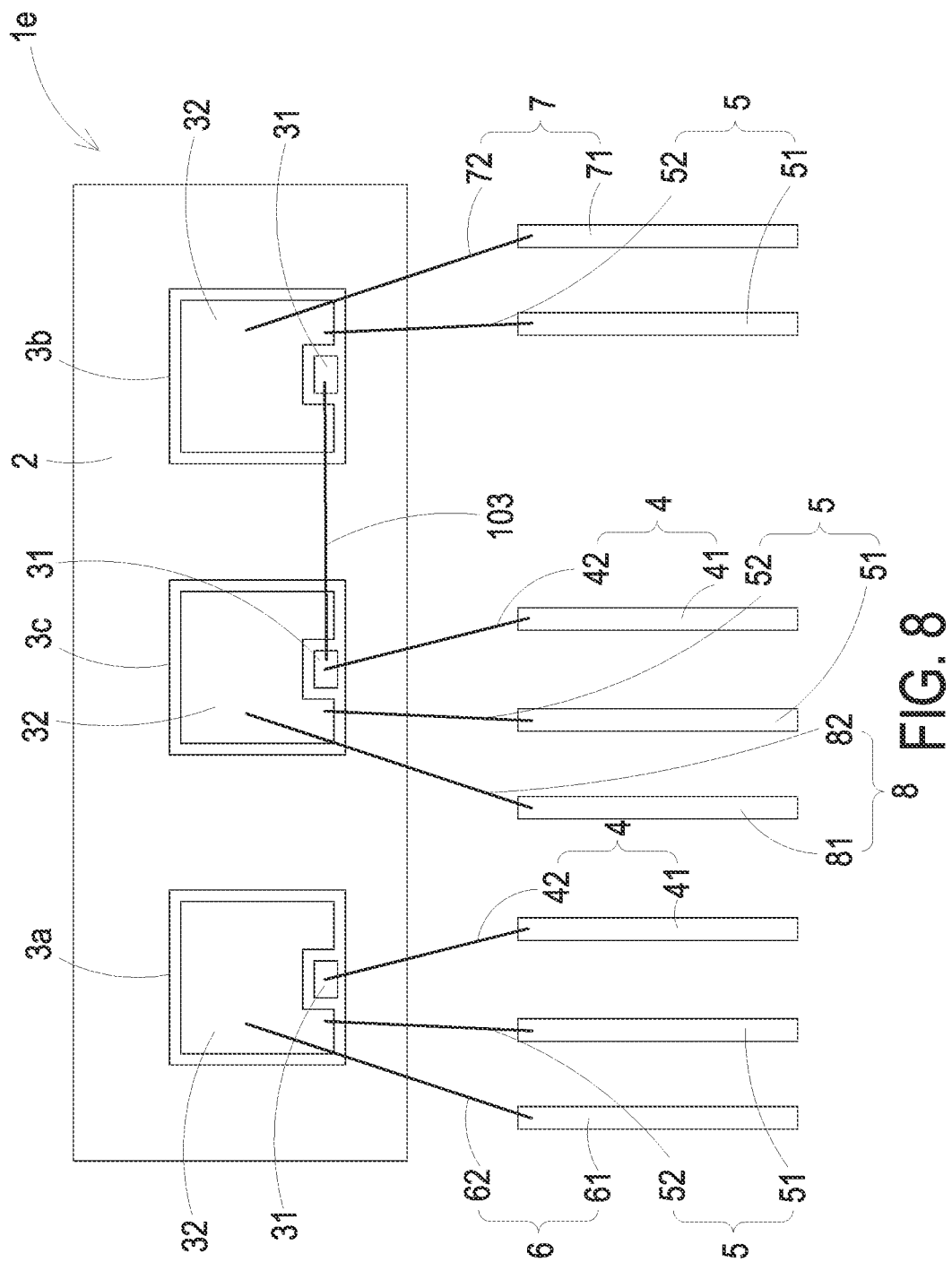
FIG. 8 is a schematic view illustrating the structure of a switching module according to a sixth embodiment of the present disclosure.

FIG. 8 is a schematic view illustrating the structure of a switching module according to a sixth embodiment of the present disclosure. The structures and functions of the components of the switching module 1e which are identical to those of the fifth embodiment as shown in FIG. 7 are not redundantly described herein. In comparison with the switching module 1d of FIG. 7, the switching module 1e further includes a third connecting conductor 103. The third connecting conductor 103 is connected between the first control terminal 31 of the second switching element 3b and the first control terminal 31 of the third switching element 3c. Consequently, one first control part 4 is shared by the second switching element 3b and the third switching element 3c of the switching module 1e. Since the first control part 4 connected with the third switching element 3c is shared by the second switching element 3b and the third switching element 3c, the first control part 4 connected with the second switching element 3b as shown in FIG. 7 is omitted in the switching module 1e of this embodiment. It is noted that numerous modifications and alterations may be made while retaining the teachings of the disclosure. For example, in another embodiment, one second control part 5 is shared by the second switching element 3b and the third switching element 3c of the switching module 1e. In addition, a connecting conductor is connected between the common conductive terminal 32 of the second switching element 3b and the common conductive terminal 32 of the third switching element 3c. In some other embodiments, the number of switching elements sharing the same control part is not restricted to two. That is, the number of switching elements sharing the same control part may be increased according to the practical requirements.

Figure 9:
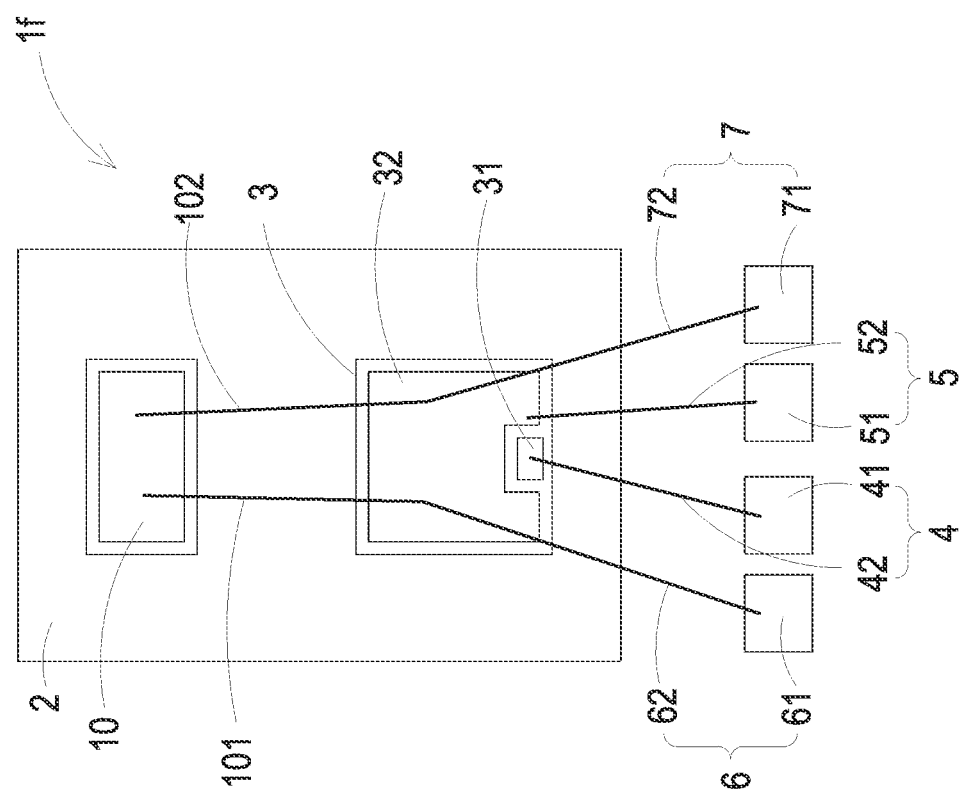
FIG. 9 is a schematic view illustrating the structure of a switching module according to a seventh embodiment of the present disclosure.

FIG. 9 is a schematic view illustrating the structure of a switching module according to a seventh embodiment of the present disclosure. The structures and functions of the components of the switching module 1f which are identical to those of the first embodiment as shown in FIG. 1 are not redundantly described herein. In comparison with the switching module 1 as shown in FIG. 1, the switching module 1f further includes a diode 10, a first connecting conductor 101 and a second connecting conductor 102. The diode 10 is disposed on the substrate 2. The first connecting conductor 101 is connected between a terminal of the diode 10 and the common conductor terminal 32 of the switching element 3. In addition, the first connecting conductor 101 is connected with the first power conductor 62 of the first power part 6. The second connecting conductor 102 is connected between the same terminal of the diode 10 and the common conductor terminal 32 of the switching element 3. In addition, the second connecting conductor 102 is connected with the second power conductor 72 of the second power part 7. Similarly, the projections of the first connecting conductor 101 and the second connecting conductor 102 on the reference plane are symmetrically located at two opposite sides of the projections of two control parts 4 and 5 on the reference plane. Consequently, the mutual inductance between the two connecting conductors 101, 102 and the control loop is as small as possible.

Figure 10:
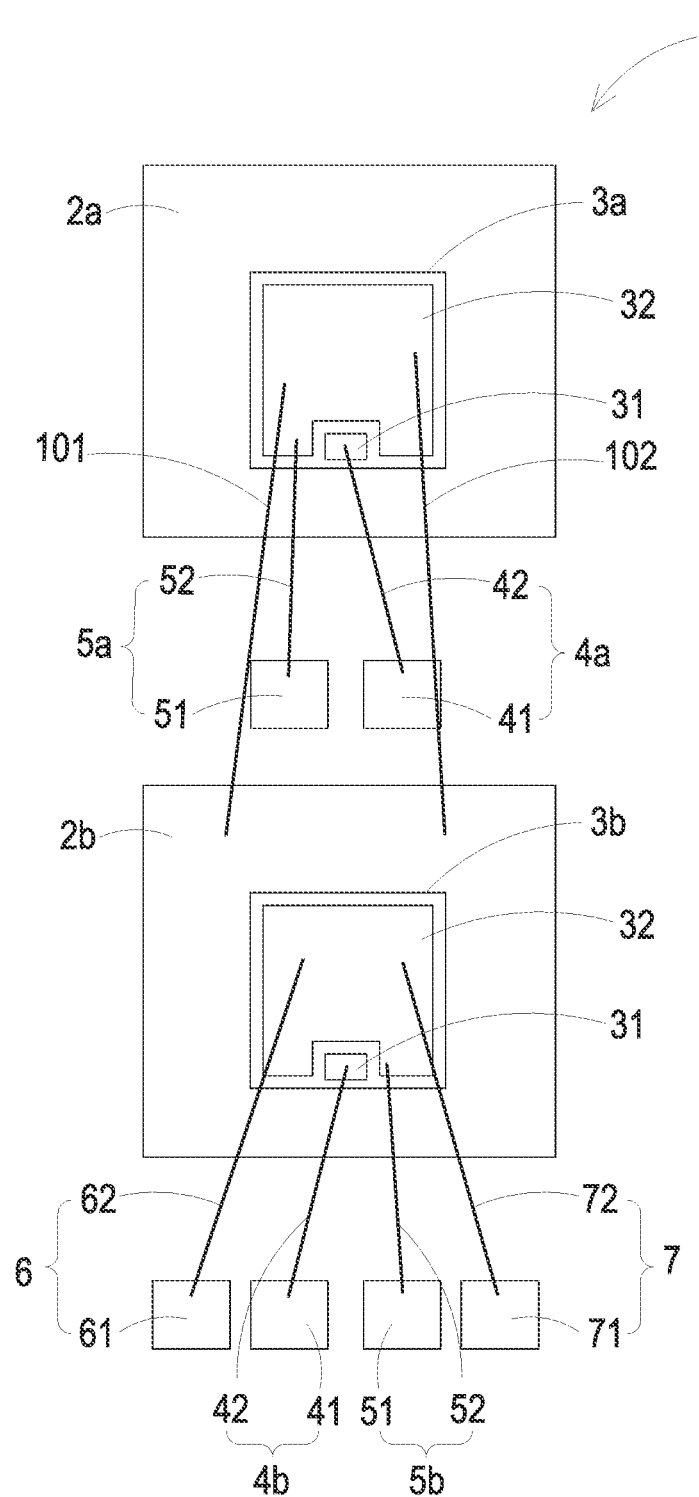
FIG. 10 is a schematic view illustrating the structure of a switching module according to the eighth embodiment of the present disclosure.

FIG. 10 is a schematic view illustrating the structure of a switching module according to the eighth embodiment of the present disclosure. The structures and functions of the components of the switching module 1g which are identical to those of the first embodiment as shown in FIG. 1 are not redundantly described herein. In comparison with the switching module 1 as shown in FIG. 1, the switching module 1g includes two substrates, two switching elements, two first control parts 4a, 4b, two second control parts 5a, 5b, a first power part 6 and a second power part 7. The two substrates include a first substrate 2a and a second substrate 2b. The two switching elements include a first switching element 3a and a second switching element 3b.

The first switching element 3a is disposed on the first substrate 2a. The second switching element 3b is disposed on the second substrate 2b. The first control part 4a is connected with the first control terminal 31 of the first switching element 3a. The first control part 4b is connected with the first control terminal 31 of the second switching element 3b. The second control part 5a is connected with the common conductive terminal 32 of the first switching element 3a. The second control part 5b is connected with the common conductive terminal 32 of the second switching element 3b.

The first power part 6 is connected with the common conductive terminal 32 of the second switching element 3b. The second power part 7 is connected with the common conductive terminal 32 of the second switching element 3b. In this embodiment, the first control part 4a and the second control part 5a are located at a first side of the second substrate 2b. In addition, the first control part 4a and the second control part 5a are arranged between the first substrate 2a and the second substrate 2b. The first power part 6, the first control part 4b, the second control part 5b and the second power part 7 are located at a second side of the second substrate 2b. The first side and the second side of the second substrate 2b are opposite to each other. In this embodiment, the first power part 6, the first control part 4b, the second control part 5b and the second power part 7 are arranged sequentially.

In this embodiment, the switching module 1g further includes a first connecting conductor 101 and a second connecting conductor 102. The first connecting conductor 101 is connected between the common conductive terminal 32 of the first switching element 3a and the second substrate 2b. The second connecting conductor 102 is connected between the common conductive terminal 32 of the first switching element 3a and the second substrate 2b. Consequently, the first switching element 3a and the second switching element 3b are connected with each other in series.

Preferably, the first connecting conductor 101 and the second connecting conductor 102 are located at two opposite sides with respect to the first control part 4a and the second control part 5a. That is, the projections of the first connecting conductor 101 and the second connecting conductor 102 on the reference plane are located at the two opposite sides of the projections of the two control parts 4a and 5a on the reference plane, respectively. Consequently, the mutual inductance is reduced. In an embodiment, the length of the first connecting conductor 101 and the length of the second connecting conductor 102 are equal. Consequently, the magnitude of the current flowing through the first connecting conductor 101 and the magnitude of the current flowing through the second connecting conductor 102 are equal. Since the first connecting conductor 101 and the second connecting conductor 102 are symmetric with respect to the control loop, the effect of cancelling out the magnetic fluxes is further improved. Consequently, the mutual inductance is further reduced.

Figure 11:
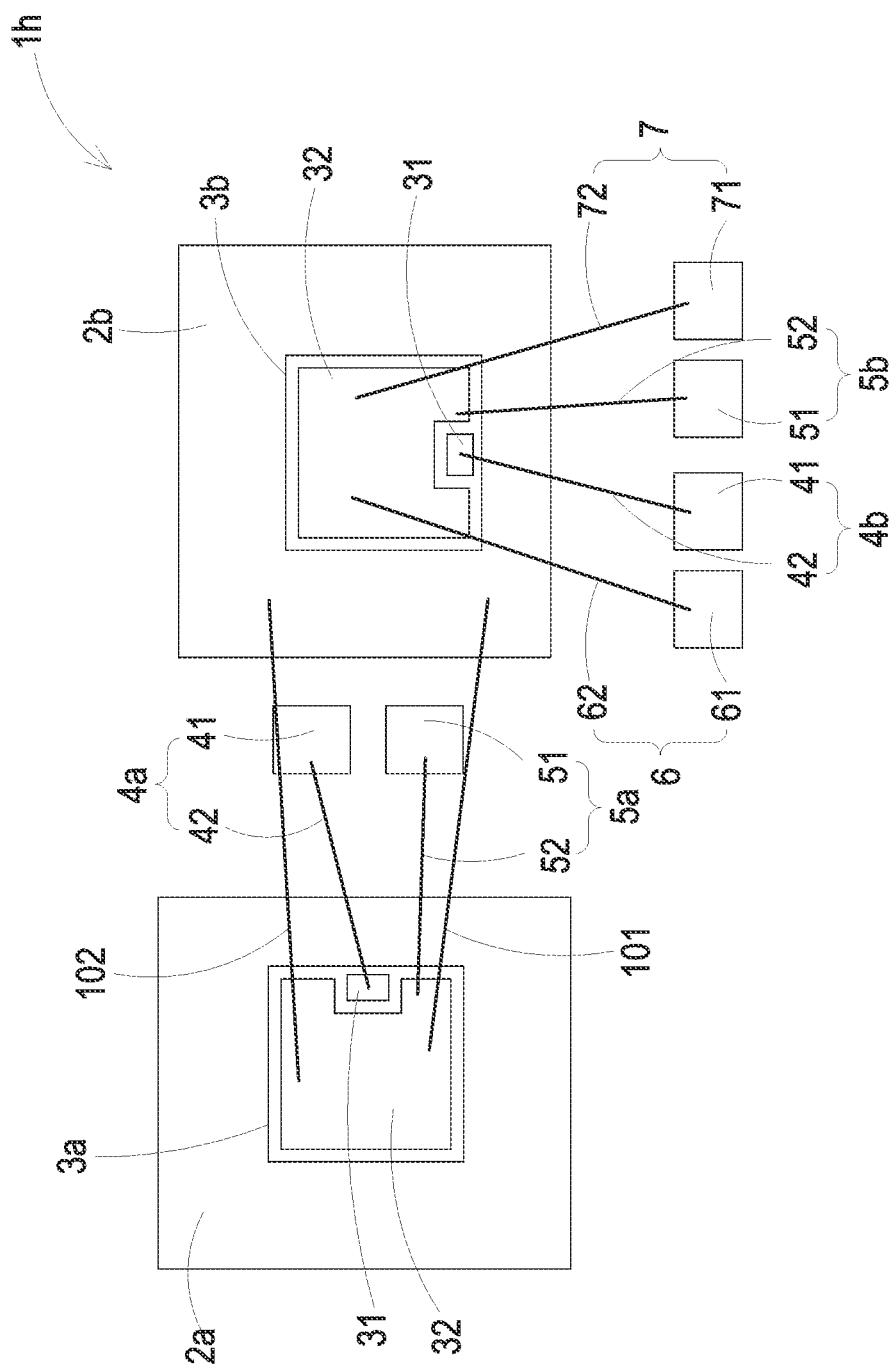
FIG. 11 is a schematic view illustrating the structure of a switching module according to a ninth embodiment of the present disclosure.

FIG. 11 is a schematic view illustrating the structure of a switching module according to a ninth embodiment of the present disclosure. The structures and functions of the components of the switching module 1h which are identical to those of the eighth embodiment as shown in FIG. 10 are not redundantly described herein. In comparison with the switching module 1g as shown in FIG. 10, the positions of the first switching element 3a, the first control part 4a and the second control part 5a of the switching module 1g are different. The first control part 4a and the second control part 5a are located at a third side of the second substrate 2b. In addition, the first control part 4a and the second control part 5a are arranged between the first substrate 2a and the second substrate 2b. The first power part 6, the first control part 4b, the second control part 5b and the second power part are located at the second side of the second substrate 2b. The first side and the second side of the second substrate 2b are opposite to each other. In addition, the third side of the second substrate 2b is arranged between the first side and the second side of the second substrate 2b.

Figure 12:
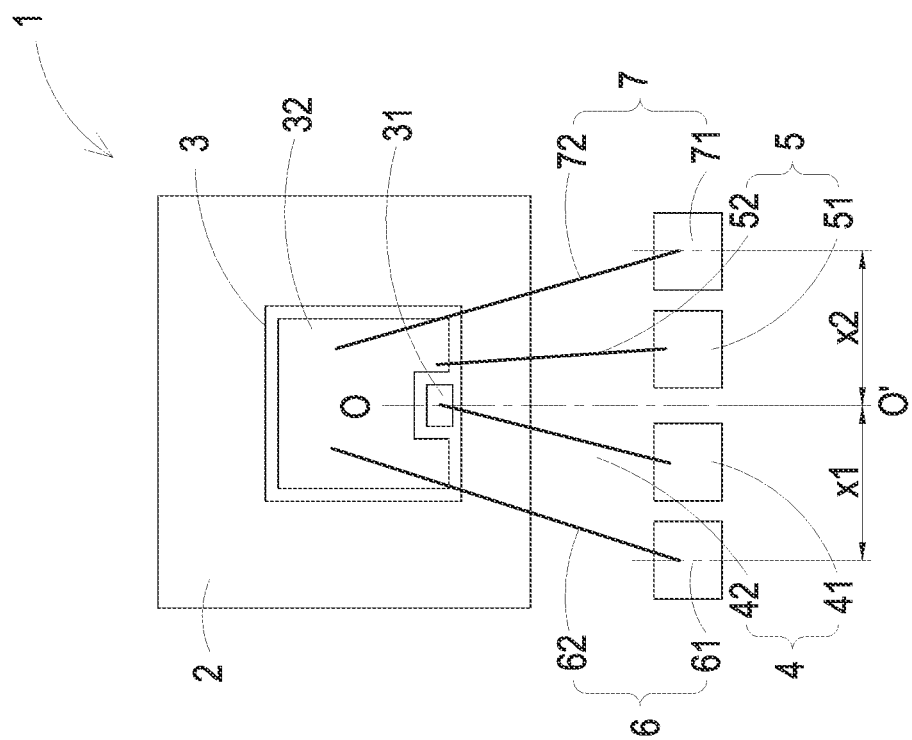
FIG. 12 schematically illustrates a first example of the relationship between the first control part, the second control part and the control loop of the switching module as shown in FIG. 1.

FIG. 12 schematically illustrates a first example of the relationship between the first control part, the second control part and the control loop of the switching module as shown in FIG. 1. As mentioned above, the center line O-O' of the control loop is defined by the first control part 4 and the second control part 5. As shown in FIG. 12, the center line O-O' of the control loop passes through the center of the first control terminal 31 of the switching element 3 and a center of a line segment connecting the center of the first control pin 41 of the first control part 4 and the center of the second control pin 51 of the second control part 5. The smallest distance between the projection of the first power pin 61 of the first power part 6 on the reference plane and the center line O-O' of the control loop is defined as a first distance X1. The smallest distance between the projection of the second power pin 71 of the second power part 7 on the reference plane and the center line O-O' of the control loop is defined as a second distance X2. In some embodiments, the minimum of the first distance X1 is 1 mm, and the minimum of the second distance X2 is 1 mm.

In case that the magnitude of the first current flowing through the first power part 6 and the magnitude of the second current flowing through the second power part 7 are equal, it is necessary to assure that the first power part 6 and the second power part 7 are symmetric with respect to the control loop of the first control part 4 and the second control part 5. If the first power part 6 and the second power part 7 are symmetric with respect to the control loop, the magnetic flux corresponding to the first current flowing through the first power part 6 and the magnetic flux corresponding to the second current flowing through the second power part 7 can be effectively cancelled out. Whether the first power part 6 and the second power part 7 are symmetric with respect to the control loop can be determined according to the asymmetry percentage of the first power part 6 and the second power part 7 with respect to the center line O-O' of the control loop.

The asymmetry percentage of the first power part 6 and the second power part 7 with respect to the center line O-O' of the control loop is defined as the absolute value of the difference between the first distance X1 and the second distance X2 divided by the smaller one of the first distance X1 and the second distance X2. For example, if the first distance X1 is smaller than the second distance X2, the asymmetry percentage is expressed as (X2−X1)/X1. Whereas, if the second distance X2 is smaller than the first distance X1, the asymmetry percentage is expressed as (X1−X2)/X2.

A smaller asymmetry percentage indicates a better symmetry of the projection areas of the first power part 6 and the second power part 7 (on the reference plane) with respect to the center line O-O' of the control loop. A larger asymmetry percentage indicates a worse symmetry of the projections of the first power part 6 and the second power part 7 (on the reference plane) with respect to the center line O-O' of the control loop.

As mentioned above, if the magnetic flux corresponding to the first current P1 flowing through the first power part 6 and the magnetic flux corresponding to the second current P2 flowing through the second power part 7 are cancelled out, the mutual inductance between the first power part 6 (and the second power part 7) and the control loop is reduced. For achieving this purpose, the asymmetry percentage of the first power part 6 and the second power part 7 with respect to the center line O-O' of the control loop needs to be smaller than or equal to a predetermined asymmetry percentage (e.g., 60%, 40% or 20%). In case that the asymmetry percentage is 0%, the projections of the first power part 6 and the second power part 7 on the reference plane are completely symmetric with respect to the center line O-O' of the control loop. When the asymmetry percentage is smaller than 40%, the mutual inductance between the first power part 6 (and the second power part 7) and the control loop is reduced and the switching speed of the switching module 1 is increased by 50%, basing on case of 100% asymmetry percentage. In case that the asymmetry percentage is further reduced, the switching speed of the switching module 1 is further increased.

Figure 13:
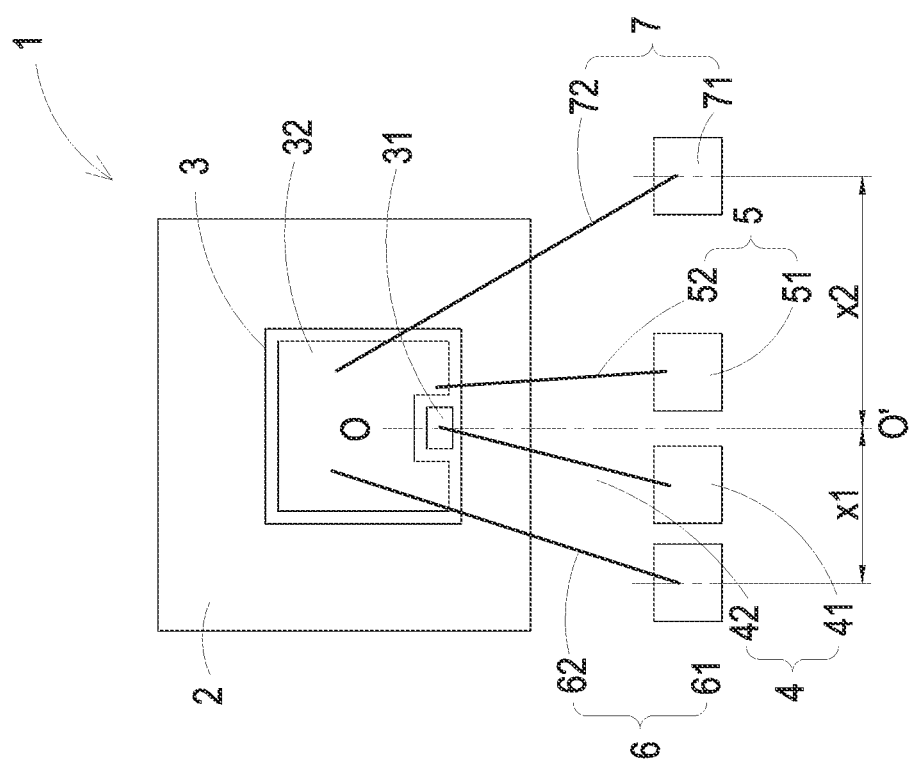
FIG. 13 schematically illustrates a second example of the relationship between the first control part, the second control part and the control loop of the switching module as shown in FIG. 1.

Please refer to FIGS. 1, 12 and 13. FIG. 13 schematically illustrates a second example of the relationship between the first control part, the second control part and the control loop of the switching module as shown in FIG. 1. In this embodiment, the magnitude of the first current P1 flowing through first power part 6 and the magnitude of the second current P2 flowing through the second power part 7 are different. By adjusting the first distance X1 and the second distance X2, the magnetic flux corresponding to the first current P1 flowing through the first power part 6 and the magnetic flux corresponding to the second current P2 flowing through the second power part 7 can be cancelled out. In case that the magnitude of the first current P1 flowing through first power part 6 is greater than the magnitude of the second current P2 flowing through the second power part 7, the first distance X1 is set to be greater than the second distance X2. Consequently, the magnetic flux corresponding to the first current P1 flowing through the first power part 6 and the magnetic flux corresponding to the second current P2 flowing through the second power part 7 can be cancelled out. Whereas, in case that the magnitude of the first current P1 flowing through first power part 6 is lower than the magnitude of the second current P2 flowing through the second power part 7, the first distance X1 is set to be smaller than the second distance X2. Consequently, the magnetic flux corresponding to the first current P1 flowing through the first power part 6 and the magnetic flux corresponding to the second current P2 flowing through the second power part 7 can also be cancelled out. In an embodiment, the minimum of the first distance X1 is 1 mm, and the minimum of the second distance X2 is 1 mm.

Figure 14:
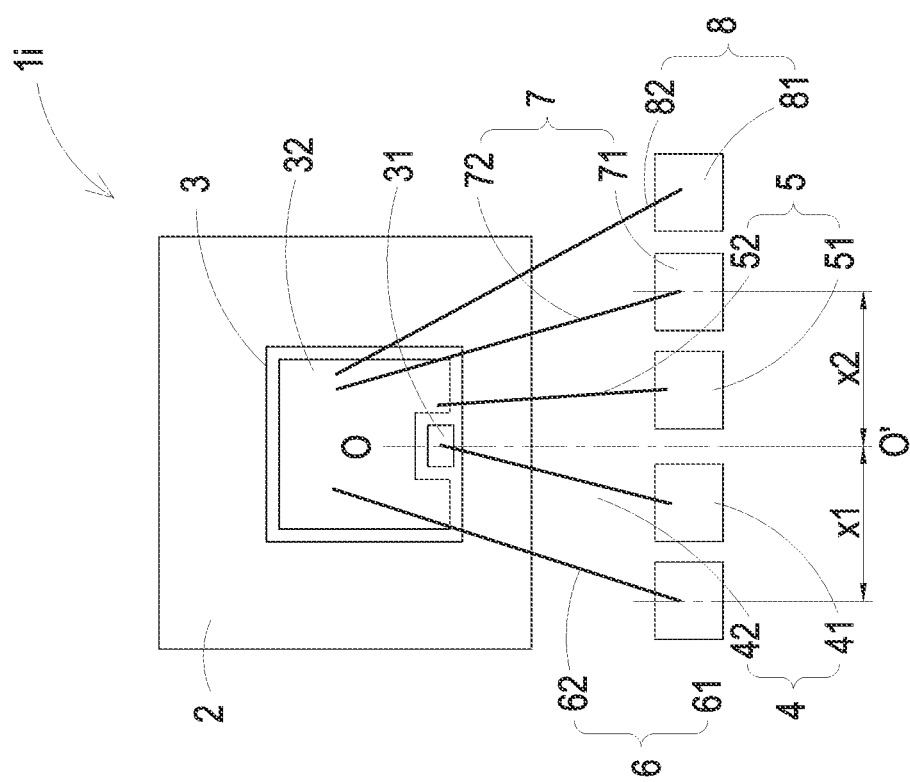
FIG. 14 is a schematic view illustrating the structure of a switching module according to a tenth embodiment of the present disclosure.

FIG. 14 is a schematic view illustrating the structure of a switching module according to a tenth embodiment of the present disclosure. The structures and functions of the components of the switching module 1i which are identical to those of the first embodiment as shown in FIG. 1 are not redundantly described herein. In comparison with the switching module 1, the switching module 1i of this embodiment further includes a third power part 8. The third power part 8, the first power part 6 and the second power part 7 are connected with the common conductive terminal 32 of the corresponding switching elements 3. The third power part 8 includes a third power pin 81 and a third power conductor 82. The third power pin 81 is disposed on the main circuit board. The third power conductor 82 is connected between the third power pin 81 and the common conductor terminal 32 of the corresponding switching element 3. Moreover, a third current flows through the third power part 8. The direction of the first current, the direction of the second current and the direction of the third current are identical.

In an embodiment, the first current, the second current and the third current flow from the common conductive terminal 32 of the switching module 1i to the corresponding power pins. In this embodiment, the second power part 7 and the third power part 8 are located at the same side with respect to the control loop, and the second power part 7 and the first power part 6 are located at opposite sides with respect to the control loop. Consequently, the direction of the magnetic flux through the control loop corresponding to the second current flowing through the second power part 7 and the direction of the magnetic flux through the control loop corresponding to the third current flowing through the third power part 8 are identical, and the direction of the magnetic flux through the control loop corresponding to the second current flowing through the second power part 7 and the direction of the magnetic flux through the control loop corresponding to the first current flowing through the first power part 6 are opposite.

Similarly, the smallest distance between the projection of the first power pin 61 on the reference plane and the center line O-O' of the control loop is defined as a first distance X1. Similarly, the smallest distance between the projection of the second power pin 71 on the reference plane and the center line O-O' of the control loop is defined as a second distance X2. In addition, the smallest distance between the projection of the third power pin 81 on the reference plane and the center line O-O' of the control loop is defined as a third distance. For balancing the magnetic fluxes at the two opposite sides of the control loop, it is preferred that the first distance X1 is equal to the second distance X2. Since the third distance is much longer than the first distance X1 and the second distance X2, the magnetic flux corresponding to the third current flowing through the third power part 8 has small influence on the control loop. Consequently, the purpose of cancelling out the magnetic fluxes can be achieved.

It is noted that numerous modifications and alterations may be made while retaining the teachings of the disclosure. For example, in another embodiment, the switching module includes a plurality of third power parts 8. The plurality of third power parts 8 are located at the same side of the control loop. Alternatively, some of the third power parts 8 are located at a first side of the control loop, and the others of the third power parts 8 are located at a second side of the control loop. For controlling the mutual inductance of the first and second power loops and the control loop and increasing the switching speed of the switching module by 50%, the number of the third power parts 8 at the first side of the control loop and the number of the third power parts 8 at a second side of the control loop should be specially designed. For example, the sum of the numbers of the first power part 6 and the third power part 8 located at one side of the control loop is defined as the first number, and the sum of the numbers of the second power part 7 and the third power part 8 located at the other side of the control loop is defined as the second number. The absolute value of the difference between the first number and the second number is smaller than or equal to 3.

From the above description, the direction of the first current flowing through the first power part and the direction of the second current flowing through the second power part are identical. In addition, the projection of the first power part on the reference plane and the projection of the second power part on the reference plane are located at two sides of the control loop of the switching module. Consequently, the mutual inductance of the control loop is reduced, and the safety performance of the switching module is enhanced.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A switching module, comprising:
   at least one substrate;
   at least one switching element disposed on the at least one substrate;

at least one control loop connected with the corresponding switching element;
a first power part connected with the corresponding switching element; and
a second power part connected with the corresponding switching element,
wherein a direction of a first current flowing through the first power part and a direction of a second current flowing through the second power part are identical, and a projection of the first power part on a reference plane and a projection of the second power part on the reference plane are located at two opposite sides of a projection of the control loop on the reference plane, wherein a physical space enclosed by the control loop on the reference plane does not comprise any power part.

2. The switching module according to claim 1, wherein the switching element comprises a first control terminal, a second control terminal, a first power terminal and a second power terminal, and the control loop comprises a first control part and a second control part, wherein the first control part is connected with the first control terminal of the corresponding switching element, and the second control part is connected with the second control terminal of the corresponding switching element, wherein both of the first power part and the second power part are connected with the first power terminal of the corresponding switching element, or both of the first power part and the second power part are connected with the second power terminal of the corresponding switching element.

3. The switching module according to claim 2, wherein the projection of the first power part on the reference plane and the projection of the second power part on the reference plane are located at two opposite sides of projections of the first control part and the second control part on the reference plane, and an asymmetry percentage of the projections of the first power part and the second power part with respect to a center line between the first control part and the second control part is smaller than or equal to 60%.

4. The switching module according to claim 3, wherein a distance between the projection of the first power part on the reference plane and the center line and a distance between the projection of the second power part on the reference plane and the center line are equal.

5. The switching module according to claim 4, wherein a magnitude of the first current and a magnitude of the second current are equal.

6. The switching module according to claim 3, wherein a minimum of a distance between the projection of the first power part on the reference plane and the center line is 1 mm, and a minimum of a distance between the projection of the second power part on the reference plane and the center line is 1 mm.

7. The switching module according to claim 3, wherein when a magnitude of the first current is greater than a magnitude of the second current, a distance between the projection of the first power part on the reference plane and the center line is greater than a distance between the projection of the second power part on the reference plane and the center line, wherein when the magnitude of the first current is lower than the magnitude of the second current, the distance between the projection of the first power part on the reference plane and the center line is smaller than the distance between the projection of the second power part on the reference plane and the center line.

8. The switching module according to claim 2, wherein both of the first power part and the second power part are connected with the first power terminal of the corresponding switching element, wherein the first power part comprises a first power conductor and a first power pin, the second power part comprises a second power conductor and a second power pin, the first control part comprises a first control conductor and a first control pin, and the second control part comprises a second control conductor and a second control pin, wherein the first power conductor is connected between the first power terminal of the corresponding switching element and the first power pin, the second power conductor is connected between the first power terminal of the corresponding switching element and the second power pin, the first control conductor is connected between the first control terminal of the corresponding switching element and the first control pin, and the second control conductor is connected between the second control terminal of the corresponding switching element and the second control pin, wherein a projection of the first power conductor on the reference plane and a projection of the second power conductor on the reference plane are located at two opposite sides of a projection of the first control conductor on the reference plane and a projection of the second control conductor on the reference plane.

9. The switching module according to claim 8, wherein a projection of the first power pin on the reference plane and a projection of the second power pin on the reference plane are located at two opposite sides of a projection of the first control pin on the reference plane and a projection of the second control pin on the reference plane.

10. The switching module according to claim 8, wherein the switching module further comprises at least one third power part, and the at least one third power part is connected with the first power terminal of the corresponding switching element, wherein a direction of a third current flowing through the third power part is identical to the direction of the first current and the direction of the second current, wherein a projection of the at least one third power pin on the reference plane is located at one side or two sides of the projections of the first control part and the second control part on the reference plane.

11. The switching module according to claim 10, wherein the sum of the numbers of the first power part and the at least one third power part at one of the two sides of the projections of the first control part and the second control part on the reference plane is defined as a first number, and the sum of the numbers of the second power part and the at least one third power part at the other of the two sides of the projections of the first control part and the second control part on the reference plane is defined as a second number, wherein an absolute value of a difference between the first number and the second number is smaller than or equal to 3.

12. The switching module according to claim 8, wherein the switching module further comprises a fourth power part, and the fourth power part is connected with the second power terminal of the corresponding switching element.

13. The switching module according to claim 1, wherein the at least one switching element comprises a first switching element and a second switching element, wherein the first switching element and the second switching element are disposed on the same substrate, each of the first switching element and the second switching element comprises a first control terminal, a second control terminal, a first power terminal and a second power terminal, and the at least one control loop comprises a first control loop and a second control loop, wherein the first control loop is connected with the first control terminal and the second control terminal of the first switching element, the second control loop is connected with the first control terminal and the second control terminal of the second switching element, the first power part is connected with the first power terminal of the first switching element, and the second power part is connected with the first power terminal of the second switching element, wherein the projection of the first power part on the reference plane and the projection of the second power part on the reference plane are located at two opposite sides of a projection of the first control loop on the reference plane and/or a projection of the second control loop on the reference plane.

14. The switching module according to claim 13, wherein each of the first control loop and the second control loop comprises a first control part and a second control part, wherein the first control part of the first control loop is connected with the first control terminal of the first switching element, the second control part of the first control loop is connected with the second control terminal of the first switching element, the first control part of the second control loop is connected with the first control terminal of the second switching element, and the second control part of the second control loop is connected with the second control terminal of the second switching element, wherein a projection of the first power part and a projection of the second power part on the reference plane are located at two sides of the projections of the first control part and the second control part of the first control loop on the reference plane; or a projection of the first power part and a projection of the second power part on the reference plane are located at two sides of the projections of the first control part and the second control part of the first control loop and the projections of the first control part and the second control part of the second control loop on the reference plane.

15. The switching module according to claim 14, wherein the first control part of the first control loop and the first control part of the second control loop are shared by each other, or the second control part of the first control loop and the second control part of the second control loop are shared by each other.

16. The switching module according to claim 1, wherein the at least one substrate comprises a first substrate and a second substrate, and the at least one switching element comprises a first switching element and a second switching element, wherein the first switching element is disposed on the first substrate, the second switching element is disposed on the second substrate, each of the first switching element and the second switching element comprises a first control terminal, a second control terminal, a first power terminal and a second power terminal, each control loop comprises a first control part and a second control part, and the switching module further comprises a first connecting conductor and a second connecting conductor, wherein two terminals of the first connecting conductor are respectively connected with the first power terminal of the first switching element and the second power terminal of the second switching element, and two terminals of the second connecting conductor are respectively connected with the first power terminal of the first switching element and the second power terminal of the second switching element, wherein a projection of the first connecting conductor and a projection of the second connecting conductor on the reference plane are located at the two opposite sides of a projection of the first control part and a projection of the second control part on the reference plane corresponding to the first switching element, respectively.

* * * * *